United States Patent
Ueyama et al.

(10) Patent No.: US 12,313,686 B2
(45) Date of Patent: May 27, 2025

(54) INSPECTION SYSTEM

(71) Applicant: SUBARU CORPORATION, Tokyo (JP)

(72) Inventors: Meiko Ueyama, Tokyo (JP); Hiroshi Abe, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 125 days.

(21) Appl. No.: 18/116,679

(22) Filed: Mar. 2, 2023

(65) Prior Publication Data
US 2023/0296680 A1 Sep. 21, 2023

(30) Foreign Application Priority Data
Mar. 17, 2022 (JP) .................. 2022-042979

(51) Int. Cl.
*G01R 31/382* (2019.01)
*G01N 27/20* (2006.01)

(52) U.S. Cl.
CPC .......... *G01R 31/382* (2019.01); *G01N 27/20* (2013.01)

(58) Field of Classification Search
None
See application file for complete search history.

(56) References Cited

U.S. PATENT DOCUMENTS

2002/0057097 A1* 5/2002 Kelly ............... G01N 17/02
324/700
2018/0003685 A1* 1/2018 Cummings ....... H01M 10/4228

FOREIGN PATENT DOCUMENTS

JP 2004-127550 A 4/2004

* cited by examiner

*Primary Examiner* — Jas A Sanghera
(74) *Attorney, Agent, or Firm* — TROUTMAN PEPPER LOCKE LLP

(57) ABSTRACT

An inspection system includes a battery pack, an intake duct, an exhaust duct, at least one chloride-ion detection sensor, and a first controller. The battery pack is configured to accommodate a battery equipped in a vehicle. The intake duct is configured to guide air outside the vehicle into the battery pack to air-cool the battery. The exhaust duct is configured to guide air inside the battery pack outward from the vehicle. The at least one chloride-ion detection sensor is disposed inside the battery pack and is configured to detect a chloride ion. The first controller includes at least one first processor and at least one first memory coupled to the at least one first processor. The at least one first processor is configured to execute a process including performing an inspection of corrosion of the battery pack based on a detection value detected by the chloride-ion detection sensor.

5 Claims, 10 Drawing Sheets

INSPECTION SYSTEM

CROSS-REFERENCE TO RELATED APPLICATION

The present application claims priority from Japanese Patent Application No. 2022-042979 filed on Mar. 17, 2022, the entire contents of which are hereby incorporated by reference.

BACKGROUND

The disclosure relates to inspection systems that perform inspections related to corrosion of battery packs.

For example, Japanese Unexamined Patent Application Publication No. 2004-127550 discloses a fuel cell system that cools a fuel cell by using a liquid refrigerant. In this fuel cell system, impurity ions that dissolve in ion-exchange water serving as a refrigerant are detected from a metallic pipe serving as a refrigerant flow path.

SUMMARY

An aspect of the disclosure provides an inspection system including a battery pack, an intake duct, an exhaust duct, at least one chloride-ion detection sensor, and a first controller. The battery pack is configured to accommodate a battery equipped in a vehicle. The intake duct is configured to guide air outside the vehicle into the battery pack to air-cool the battery. The exhaust duct is configured to guide air inside the battery pack outward from the vehicle. The at least one chloride-ion detection sensor is disposed inside the battery pack and is configured to detect a chloride ion. The first controller includes at least one first processor and at least one first memory coupled to the first processor. The first processor is configured to execute a process including performing an inspection of corrosion of the battery pack based on a detection value of the chloride-ion detection sensor.

BRIEF DESCRIPTION OF THE DRAWINGS

The accompanying drawings are included to provide a further understanding of the disclosure and are incorporated in and constitute a part of this specification. The drawings illustrate an embodiment and, together with the specification, serve to describe the principles of the disclosure.

DETAILED DESCRIPTION

Figure 1:
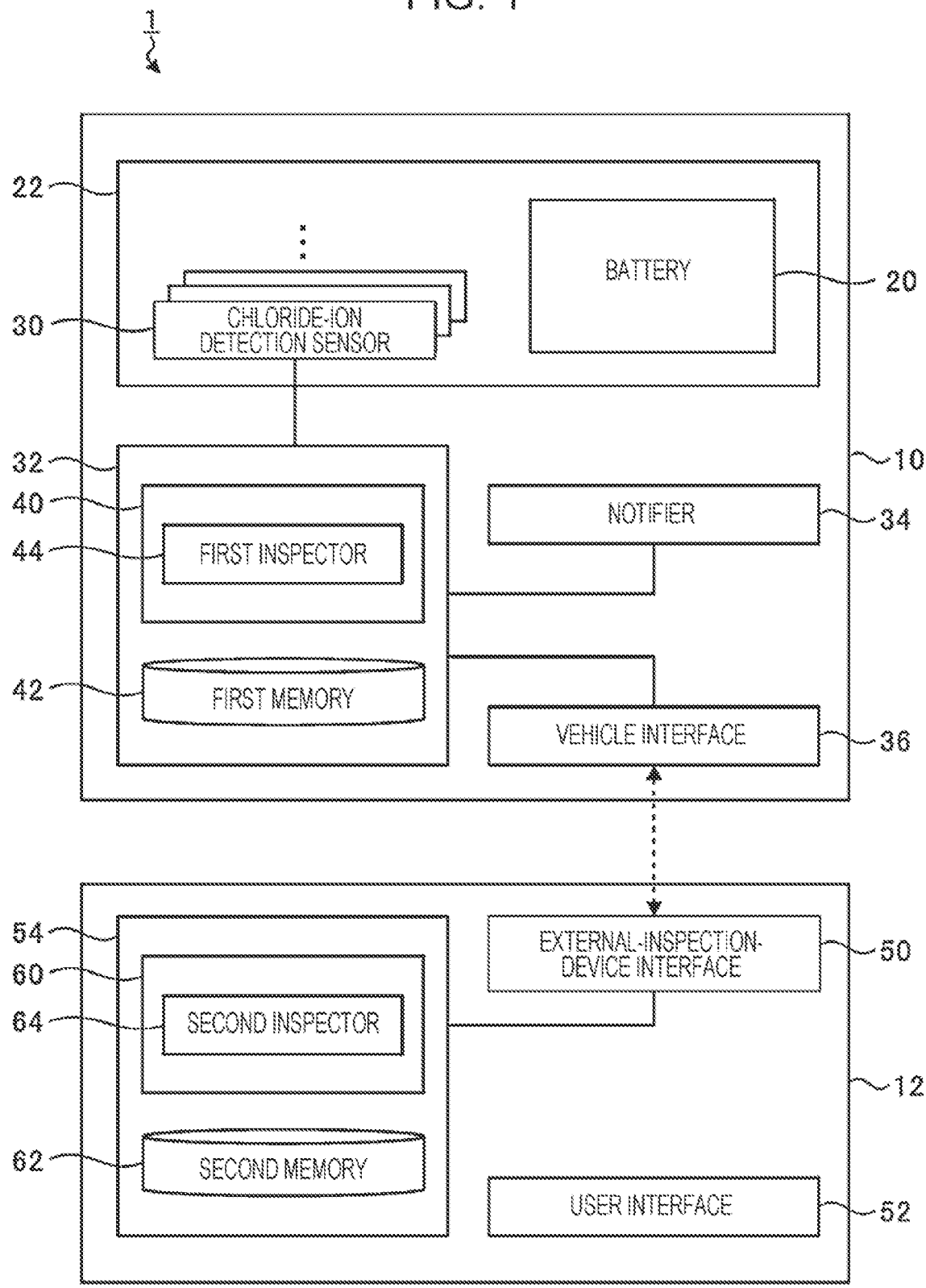
FIG. 1 is a block diagram schematically illustrating the configuration of an inspection system according to an embodiment.

Depending on the vehicle, the battery is air-cooled by using the air outside the vehicle. For example, when such a vehicle travels in a heavy snowfall region where a snow-melting agent is used, the battery is to be air-cooled by taking air containing many chloride ions outside the vehicle into a battery pack. The chloride ions in the air taken into the battery pack may cause the battery pack to corrode. When the battery pack corrodes, the function that the battery pack has for protecting the battery deteriorates.

It is desirable to provide an inspection system capable of readily detecting corrosion of a battery pack.

An embodiment of the disclosure will be described in detail below with reference to the appended drawings. For example, specific dimensions, materials, and numerical values indicated in this embodiment are merely examples for providing an easier understanding of the embodiment of the disclosure and are not intended to limit the embodiment of the disclosure, unless otherwise specified. In this description and the drawings, components having substantially identical functions and configurations are given the same reference signs, and redundant descriptions thereof are omitted. Furthermore, components that are not directly related to the embodiment of the disclosure are not illustrated in the drawings.

FIG. 1 is a block diagram schematically illustrating the configuration of an inspection system 1 according to this embodiment. The inspection system 1 includes a vehicle 10 and an external inspection device 12.

The vehicle 10 is, for example, an electric automobile or a hybrid electric automobile, and includes a motor serving as a drive source for traveling. The vehicle 10 includes a battery 20 and a battery pack 22. The battery 20 is a rechargeable secondary battery, such as a lithium ion battery. The battery 20 supplies electric power to the motor serving as the drive source.

The battery pack 22 has a shape of a hollow box. The battery 20 is accommodated inside the battery pack 22. The battery pack 22 is composed of, for example, a metallic material containing aluminum.

When a driver is using the vehicle 10, the battery 20 generates heat and increases in temperature. In order to suppress an increase in the temperature of the battery 20, the vehicle 10 has a function for cooling the battery 20. For example, the air outside the vehicle 10 is introduced into the battery pack 22 accommodating the battery 20. The battery 20 is air-cooled by the air introduced into the battery pack 22 from outside the vehicle 10.

Water vapor in the air outside the vehicle 10 may sometimes contain chloride ions. For example, in a heavy snowfall region, a snow-melting agent is used for melting snow. A snow-melting agent contains, for example, a calcium chloride or a sodium chloride. Therefore, in a place where a snow-melting agent is used, there is a high possibility that many chloride ions are contained in the air, as compared with a place where a snow-melting agent is not used.

For example, the vehicle 10 traveling in a heavy snowfall region where a snow-melting agent is used air-cools the battery 20 by taking the air containing many chloride ions outside the vehicle 10 into the battery pack 22. The chloride ions in the air taken into the battery pack 22 may cause the battery pack 22 to corrode. If the battery pack 22 is composed of a metallic material containing aluminum, the chloride ions tend to facilitate the corrosion of the battery pack 22. When the battery pack 22 corrodes, the function that the battery pack 22 has for protecting the battery 20 deteriorates.

The inspection system 1 according to this embodiment performs an inspection of corrosion in the battery pack 22 that accommodates the battery 20 equipped in the vehicle 10.

The vehicle 10 includes a chloride-ion detection sensor 30, a first controller 32, a notifier 34, and a vehicle interface 36.

The chloride-ion detection sensor 30 is provided inside the battery pack 22. For example, the chloride-ion detection sensor 30 is disposed at a position inside the battery pack 22 where condensation tends to occur. The battery pack 22 is provided with any number of chloride-ion detection sensors 30. Each chloride-ion detection sensor 30 is electrically coupled to the first controller 32. Each chloride-ion detection sensor 30 is capable of detecting a chloride ion. The chloride-ion detection sensors 30 will be described in detail later.

The first controller 32 includes at least one first processor 40 and at least one first memory 42 coupled to the first processor 40. The first memory 42 includes a read-only memory (ROM) that stores, for example, a program and a random access memory (RAM) serving as a work area. The first processor 40 operates in cooperation with the program stored in the first memory 42 so as to control each unit of the vehicle 10.

The first processor 40 executes the program to function also as a first inspector 44. The first inspector 44 performs an inspection of corrosion in the battery pack 22 based on a detection value of each chloride-ion detection sensor 30. The first inspector 44 will be described in detail later.

The notifier 34 is, for example, a warning indicator lamp disposed in an instrument panel. The notifier 34 displays an inspection result obtained by the first inspector 44. For example, if it is determined that there is a possibility of corrosion in the battery pack 22, the notifier 34 performs display to indicate that the battery pack 22 may possibly be corroded.

The vehicle interface 36 is electrically coupled to the first controller 32. The vehicle interface 36 is capable of being coupled to a connector of a cable that couples devices to each other.

The external inspection device 12 is managed by, for example, a dealer or an operator who inspects and repairs the vehicle 10. For the sake of convenience, the operator managing the external inspection device 12 may sometimes be referred to as "inspection operator" hereinafter. In the inspection system 1 according to this embodiment, if a notification indicating that there is a possibility of corrosion in the battery pack 22 is provided in the vehicle 10, the driver who drives the vehicle 10 takes the vehicle 10 to the inspection operator. Then, the inspection operator uses the external inspection device 12 to perform an inspection of the corrosion in the battery pack 22 of the vehicle 10 again.

The external inspection device 12 includes an external-inspection-device interface 50, a user interface 52, and a second controller 54.

The external-inspection-device interface 50 is electrically coupled to the second controller 54. The external-inspection-device interface 50 is capable of being coupled to the connector of the cable that couples devices to each other. Of a first terminal and a second terminal of the cable that couples devices to each other, the first terminal is coupled to the vehicle interface 36, and the second terminal is coupled to the external-inspection-device interface 50. Thus, the first controller 32 of the vehicle 10 and the second controller 54 of the external inspection device 12 are electrically coupled to each other.

The user interface 52 includes an output device that presents various kinds of information to the user. An example of such an output device is a display device that displays various kinds of images and various kinds of information. The user interface 52 also includes an input device, such as a touchscreen, configured to receive a user operation.

The second controller 54 includes at least one second processor 60 and at least one second memory 62 coupled to the second processor 60. The second memory 62 includes a ROM that stores, for example, a program and a RAM serving as a work area. The second processor 60 operates in cooperation with the program stored in the second memory 62 so as to control each unit of the external inspection device 12.

The second processor 60 executes the program to function also as a second inspector 64. The second inspector 64 can acquire the detection value of each chloride-ion detection sensor 30 via the first controller 32 in a state where the first controller 32 and the second controller 54 are electrically coupled to each other. The second inspector 64 performs an inspection of corrosion in the battery pack 22 based on the detection value of each chloride-ion detection sensor 30. The second inspector 64 will be described in detail later.

Figure 2:
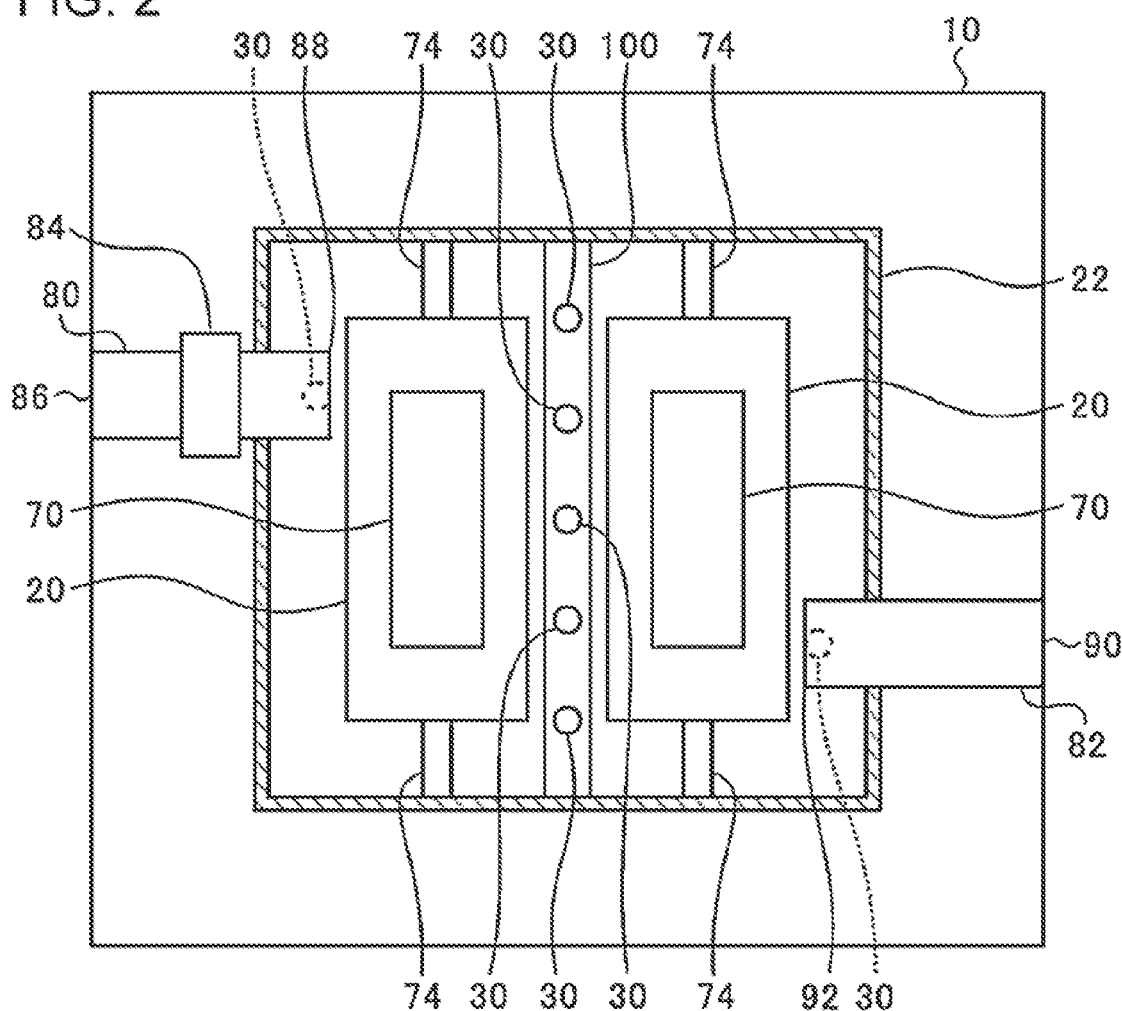
FIG. 2 is a plan view illustrating the disposition of chloride-ion detection sensors.
Figure 3:
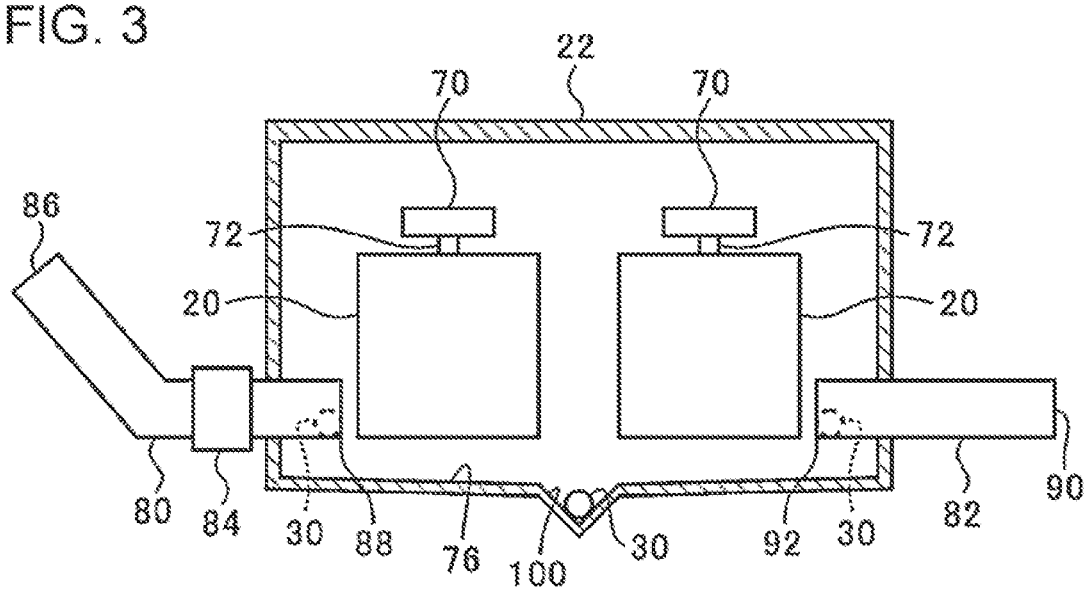
FIG. 3 is a first side perspective view illustrating the disposition of the chloride-ion detection sensors.
Figure 4:
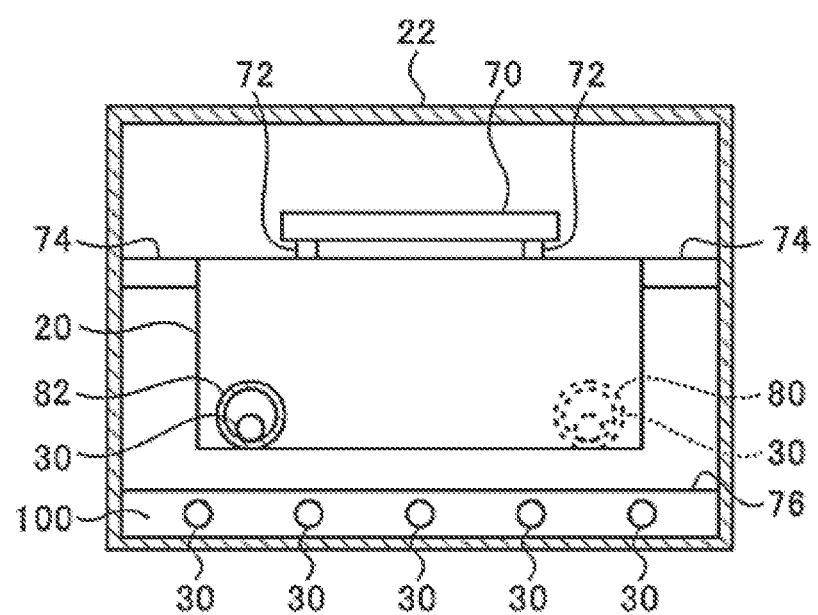
FIG. 4 is a second side perspective view illustrating the disposition of the chloride-ion detection sensors.

FIG. 2 is a plan view illustrating the disposition of the chloride-ion detection sensors 30. FIG. 3 is a first side perspective view illustrating the disposition of the chloride-ion detection sensors 30. FIG. 4 is a second side perspective view illustrating the disposition of the chloride-ion detection sensors 30. FIG. 3 is a perspective view of the battery pack 22 as viewed from the lower side in FIG. 2, and FIG. 4 is a perspective view of the battery pack 22 as viewed from the right side in FIG. 2.

In FIG. 2 to FIG. 4, two batteries 20 are accommodated inside the battery pack 22. Each battery 20 is a battery module having a plurality of series-coupled cells. The number of batteries 20 accommodated inside the battery pack 22 is not limited to two and may be any number.

For each battery 20, a battery control substrate 70 is disposed above the battery 20. The battery control substrate 70 is fixed to the battery 20 by a substrate support 72 provided on the battery 20. For example, the battery control substrate 70 detects the temperature of the battery 20 and calculates the state of charge (SOC) of the battery 20.

Arms 74 that extend to the side surfaces of the battery pack 22 are provided at upper areas of the side surfaces of each battery 20. The batteries 20 are fixed to the battery pack 22 by the arms 74. The batteries 20 are separated from a bottom 76 of the battery pack 22. The configuration is not limited to the use of the arms 74 for fixing the batteries 20 to the battery pack 22. For example, each battery 20 may be provided with a leg extending from the bottom surface of the battery 20 toward the bottom 76 of the battery pack 22, and the leg may be used to fix the battery 20 to the battery pack 22.

The vehicle 10 includes an intake duct 80, an exhaust duct 82, and a fan 84. The intake duct 80 has a tubular shape that allows the inside and the outside of the battery pack 22 to communicate with each other. The intake duct 80 has an inlet 86 serving as an end with an opening exposed to the outside of the battery pack 22, and also has an intake-outlet end 88 serving as an end with an opening exposed to the inside of the battery pack 22. For example, the inlet 86 is located at the front side of the vehicle 10. The intake-outlet end 88 is located, for example, near a side surface of one of the batteries 20.

The air outside the vehicle 10 partially enters the intake duct 80 through the inlet 86. The air that has entered the intake duct 80 flows through the intake duct 80 and is sent into the battery pack 22 through the intake-outlet end 88. The batteries 20 accommodated inside the battery pack 22 are air-cooled by the air guided into the battery pack 22 through the intake duct 80.

The exhaust duct 82 has a tubular shape that allows the inside and the outside of the battery pack 22 to communicate with each other. The exhaust duct 82 has an outlet 90 serving as an end with an opening exposed to the outside of the battery pack 22, and also has an exhaust-inlet end 92 serving as an end with an opening exposed to the inside of the battery pack 22. For example, the outlet 90 is located at the rear side of the vehicle 10. The exhaust-inlet end 92 is located, for example, near a side surface of one of the batteries 20. In detail, the exhaust-inlet end 92 is located symmetrically with respect to the intake-outlet end 88. For example, if the intake-outlet end 88 in the battery pack 22 is located toward the front-right side of the vehicle 10, the exhaust-inlet end 92 in the battery pack 22 is located toward the rear-left side of the vehicle 10.

The air inside the battery pack 22 partially enters the exhaust duct 82 through the exhaust-inlet end 92. The air that has entered the exhaust duct 82 flows through the exhaust duct 82 and is sent outside the vehicle 10 through the outlet 90.

The fan 84 is provided at, for example, an intermediate location of the intake duct 80. The fan 84 suctions the air outside the vehicle 10 into the intake duct 80 through the inlet 86, and sends the suctioned air into the battery pack 22. This facilitates the air-cooling of the batteries 20 by the air outside the vehicle 10.

Alternatively, the fan 84 may be provided at an intermediate location of the exhaust duct 82. In that case, the fan 84 suctions the air inside the battery pack 22 into the exhaust duct 82 so as to realize a negative pressure state inside the battery pack 22, whereby the air outside the vehicle 10 is taken into the battery pack 22 through the intake duct 80. As another alternative, the fan 84 may be omitted.

In a situation where a snow-melting agent is used, the outside air temperature is low to an extent that, for example, the temperature is below the freezing point. If the vehicle 10 travels in such an environment, the low-temperature air outside the vehicle 10 is introduced into the battery pack 22 through the intake duct 80. On the other hand, the temperature of the air inside the battery pack 22 is relatively high at, for example, about 60° C. due to heat generated by the batteries 20. In other words, there is a large temperature difference between the temperature of the air introduced into the battery pack 22 from outside the vehicle 10 and the temperature of the air inside the battery pack 22. Thus, condensation may occur in a portion of the air introduced into the battery pack 22 from outside the vehicle 10.

For example, the intake-outlet end 88 corresponds to a boundary where the air introduced into the battery pack 22 from outside the vehicle 10 first comes into contact with the air inside the battery pack 22. Therefore, the intake-outlet end 88 is where the temperature difference between the temperature of the air introduced into the battery pack 22 from outside the vehicle 10 and the temperature of the air inside the battery pack 22 is the largest. Accordingly, the intake-outlet end 88 is an example of a location where condensation tends to occur.

Since the outlet 90 of the exhaust duct 82 is an opening exposed to the outside of the vehicle 10, the temperature at the outlet 90 is relatively low due to the outside air temperature. Because the exhaust-inlet end 92 spatially communicates with the outlet 90 via the exhaust duct 82, the temperature at the exhaust-inlet end 92 is relatively low, similar to the outlet 90. Therefore, the exhaust-inlet end 92 is where the temperature difference with the temperature of the air inside the battery pack 22 is relatively large. Accordingly, the exhaust-inlet end 92 is also an example of a location where condensation tends to occur.

As mentioned above, the chloride-ion detection sensors 30 are disposed at locations where condensation tends to occur. In detail, the chloride-ion detection sensors 30 are disposed near the intake-outlet end 88 of the intake duct 80 and near the exhaust-inlet end 92 of the exhaust duct 82. The expression "near the intake-outlet end 88" refers to a position within a predetermined range including the intake-outlet end 88. For example, if the intake-outlet end 88 of the intake duct 80 protrudes into the battery pack 22 from where the battery pack 22 and the intake duct 80 are coupled to each other, the intake duct 80 inside the battery pack 22 relative to the coupled area of the intake duct 80 may be set as a position near the intake-outlet end 88. The expression "near the exhaust-inlet end 92" refers to a position within a predetermined range including the exhaust-inlet end 92. For example, if the exhaust-inlet end 92 of the exhaust duct 82 protrudes into the battery pack 22 from where the battery pack 22 and the exhaust duct 82 are coupled to each other, the exhaust duct 82 inside the battery pack 22 relative to the coupled area of the exhaust duct 82 may be set as a position near the exhaust-inlet end 92.

The chloride-ion detection sensors 30 are not limited to the configuration where they are provided near both the intake-outlet end 88 and the exhaust-inlet end 92. The chloride-ion detection sensor or sensors 30 may be disposed near one or more of the intake-outlet end 88 and the exhaust-inlet end 92.

The battery pack 22 has a water container 100 at the bottom 76 thereof. The water container 100 is configured such that at least an area on the inner surface of the bottom 76 of the battery pack 22 is recessed toward the outside of the battery pack 22, as compared with other locations on the inner surface of the bottom 76, so as to be capable of containing water occurring from condensation.

The water container 100 is located between, for example, the intake-outlet end 88 and the exhaust-inlet end 92. For example, the water container 100 is a groove extending along the bottom 76 of the battery pack 22. The width and the depth of the water container 100 are substantially fixed in the extending direction of the water container 100. The water container 100 is not limited to having the groove shape exemplified above, and may have any shape. Furthermore, the inner surface of the bottom 76 of the battery pack 22 may be gradually inclined downward toward the water container 100.

The water occurring from condensation naturally moves toward the bottom 76 of the battery pack 22 due to gravity. The water that has moved to the bottom 76 moves into the water container 100 due to the inclined surface of the bottom 76, so as to be contained and retained in the water container 100.

The chloride-ion detection sensors 30 are also disposed at the position of the water container 100. For example, the chloride-ion detection sensors 30 are disposed distributively in the extending direction of the groove-shaped water container 100. With the plurality of chloride-ion detection sensors 30 disposed distributively in the water container 100, the accuracy for detecting chloride ions can be enhanced.

Although five chloride-ion detection sensors 30 are disposed in the water container 100 in FIG. 2 to FIG. 4, the number of chloride-ion detection sensors 30 at the position of the water container 100 is not limited to this example and may be any number. Furthermore, the chloride-ion detection sensors 30 at the position of the water container 100 may be omitted so long as the chloride-ion detection sensor or sensors 30 is/are disposed at one or more of the intake-outlet end 88 and the exhaust-inlet end 92.

Figure 5:
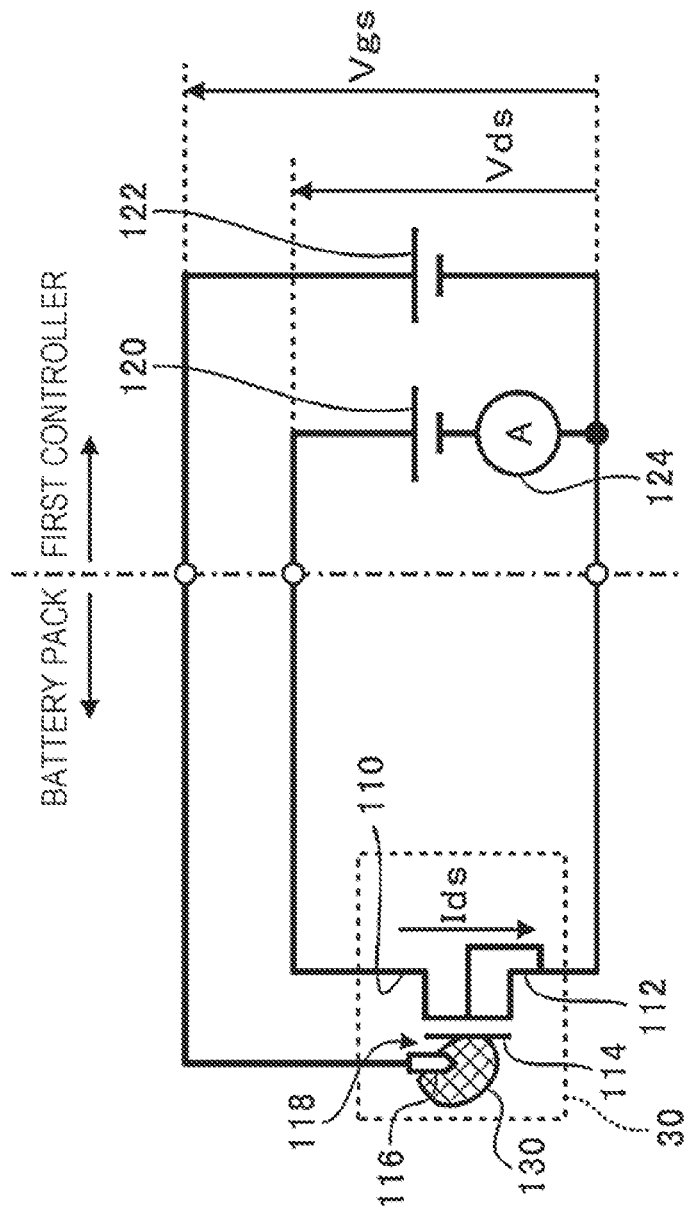
FIG. 5 is a circuit diagram illustrating a method of how each chloride-ion detection sensor detects a chloride ion.

FIG. 5 is a circuit diagram illustrating a method of how each chloride-ion detection sensor 30 detects a chloride ion. For illustrative purposes, FIG. 5 illustrates a single representative chloride-ion detection sensor 30 freely chosen from the plurality of chloride-ion detection sensors 30. However, the remaining chloride-ion detection sensors 30 are identical to the one illustrated in FIG. 5.

The chloride-ion detection sensor 30 is a semiconductor sensor, such as an ion selective field effect transistor (ISFET). The chloride-ion detection sensor 30 has a first electrode 110, a second electrode 112, a control electrode 114, and a reference electrode 116.

The first electrode 110 corresponds to the drain of the ISFET, the second electrode 112 corresponds to the source of the ISFET, and the control electrode 114 corresponds to the gate of the ISFET. The reference electrode 116 is disposed with a predetermined gap 118 from the control electrode 114.

The first controller 32 is provided with a first power source 120, a second power source 122, and a current sensor 124. The first power source 120 and the second power source 122 are implemented by, for example, a voltage follower circuit in the first controller 32. The current sensor 124 is implemented by, for example, a current sense amplifier and an analog-to-digital converter in the first controller 32.

A positive electrode of the first power source 120 is coupled to the first electrode 110 of the chloride-ion detection sensor 30. A negative electrode of the first power source 120 is coupled to the second electrode 112 of the chloride-ion detection sensor 30 via the current sensor 124. The first power source 120 applies a first bias voltage Vds between the first electrode 110 and the second electrode 112 of the chloride-ion detection sensor 30. The first bias voltage Vds corresponds to a drain-source voltage of the ISFET.

The current sensor 124 detects an output current Ids serving as an electric current between the first electrode 110 and the second electrode 112 of the chloride-ion detection sensor 30. The output current Ids corresponds to a drain-source current of the ISFET.

A positive electrode of the second power source 122 is coupled to the reference electrode 116 of the chloride-ion detection sensor 30. A negative electrode of the second power source 122 is coupled to the second electrode 112 of the chloride-ion detection sensor 30. The second power source 122 applies a second bias voltage Vgs between the reference electrode 116 and the second electrode 112 of the chloride-ion detection sensor 30. The second bias voltage Vgs corresponds to a reference-electrode-source voltage, that is, a gate-source voltage, of the ISFET.

As mentioned above, the gap 118 exists between the reference electrode 116 and the control electrode 114. Accordingly, if the gap 118 has no chloride ions, the control electrode 114 is insulated from the reference electrode 116. In other words, even when the second bias voltage Vgs is applied to the reference electrode 116, if the gap 118 has no chloride ions, a voltage is not applied to the control electrode 114, so that there is no flow of the output current Ids.

It is assumed that water 130 is adhered astride the reference electrode 116 and the control electrode 114 at the location of the gap 118. The water 130 may be water vapor. It is assumed that the water 130 contains chloride ions. This implies that the gap 118 has chloride ions.

In the chloride-ion detection sensor 30, the electric potential of the control electrode 114 changes in accordance with the voltage to be applied to the reference electrode 116 and the concentration of chloride ions in the gap 118. For example, in the chloride-ion detection sensor 30, the electric potential of the control electrode 114 increases with increasing concentration of chloride ions in the gap 118 even if the voltage to be applied to the reference electrode 116 is a fixed value. Furthermore, in the chloride-ion detection sensor 30, if the gap 118 has a fixed concentration of chloride ions, the electric potential of the control electrode 114 increases with increasing voltage to be applied to the reference electrode 116.

In the chloride-ion detection sensor 30, the output current Ids between the first electrode 110 and the second electrode 112 changes in accordance with a change in the electric potential of the control electrode 114. For example, in the chloride-ion detection sensor 30, the output current Ids between the first electrode 110 and the second electrode 112 increases with increasing electric potential of the control electrode 114.

Accordingly, the chloride-ion detection sensor 30 outputs the output current Ids according to the concentration of chloride ions in the gap 118. The output current Ids corresponds to the detection value of the chloride-ion detection sensor 30. The first controller 32 measures the output current Ids of the chloride-ion detection sensor 30 by using the current sensor 124, so as to be capable of acquiring a chloride-ion detection result obtained by the chloride-ion detection sensor 30.

In view of this, if the output current Ids exceeds a predetermined threshold value, it can be regarded that the concentration of chloride ions in the gap 118 is high. If the concentration of chloride ions is high, it can be estimated that the possibility of corrosion in the battery pack 22 is high. The predetermined threshold value is set to an appropriate value based on which it is determinable that the possibility of corrosion in the battery pack 22 is high. This predetermined threshold value is set in advance in accordance with, for example, a test.

Figure 6:
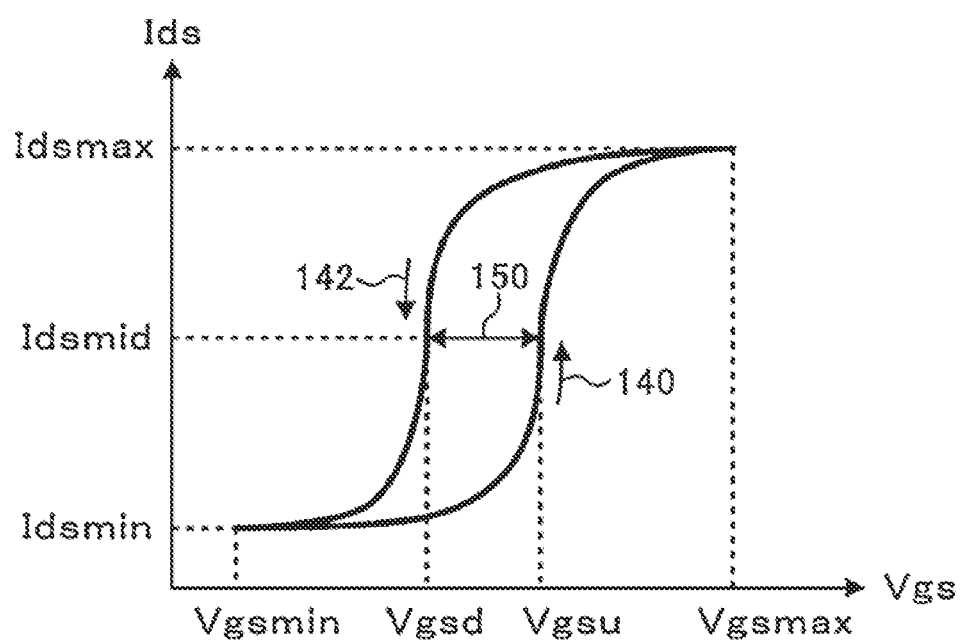
FIG. 6 illustrates the characteristics of each chloride-ion detection sensor.

FIG. 6 illustrates the characteristics of the chloride-ion detection sensor 30. In FIG. 6, the abscissa axis denotes the second bias voltage Vgs, and the ordinate axis denotes the output current Ids. FIG. 6 illustrates an example where the gap 118 has a relatively high concentration of chloride ions.

As illustrated in FIG. 6, when the gap 118 has a high concentration of chloride ions, the output current Ids relative to the second bias voltage Vgs exhibits a so-called hysteresis response.

For example, it is assumed that the second bias voltage Vgs is increased from a minimum voltage Vgsmin within a predetermined range to a maximum voltage Vgsmax within the predetermined range, and the output current Ids at that time is measured. In this case, the output current Ids changes along a path indicated with an upward arrow 140 in FIG. 6.

The minimum voltage Vgsmin and the maximum voltage Vgsmax may be, for example, 1 V and 5V, respectively, but may each be any value.

On the other hand, it is assumed that the second bias voltage Vgs is decreased from the maximum voltage Vgsmax to the minimum voltage Vgsmin, and the output current Ids at that time is measured. In this case, the output current Ids changes along a path indicated with a downward arrow 142 in FIG. 6.

It is assumed that the output current Ids corresponding to the minimum voltage Vgsmin is defined as a minimum current Idsmin, the output current Ids corresponding to the maximum voltage Vgsmax is defined as a maximum current Idsmax, and the output current Ids between the maximum current Idsmax and the minimum current Idsmin is defined as an intermediate current Idsmid.

The second bias voltage Vgs corresponding to the intermediate current Idsmid when the second bias voltage Vgs is increased is an increase voltage Vgsu. On the other hand, the second bias voltage Vgs corresponding to the intermediate current Idsmid when the second bias voltage Vgs is decreased is a decrease voltage Vgsd. The decrease voltage Vgsd is lower than the increase voltage Vgsu. In other words, as indicated with a double arrow 150 in FIG. 6, the second bias voltage Vgs corresponding to the intermediate current Idsmid has a voltage range equivalent to an amount of subtraction of the decrease voltage Vgsd from the increase voltage Vgsu.

Such a voltage range increases as the concentration of chloride ions in the gap 118 increases.

In view of this, it can be determined whether a change in the output current Ids relative to a change in the second bias voltage Vgs is a hysteresis response by determining whether the voltage range is larger than or equal to a predetermined voltage range. In a case where it is determined that the aforementioned change in the output current Ids is a hysteresis response, such a case is equivalent to a relatively high concentration of chloride ions in the gap 118, so that it can be estimated that the possibility of corrosion in the battery pack 22 is high. The predetermined voltage range is set to an appropriate value based on which it is determinable that the possibility of corrosion in the battery pack 22 is high. This predetermined voltage range is set in advance in accordance with, for example, a test.

Figure 7:
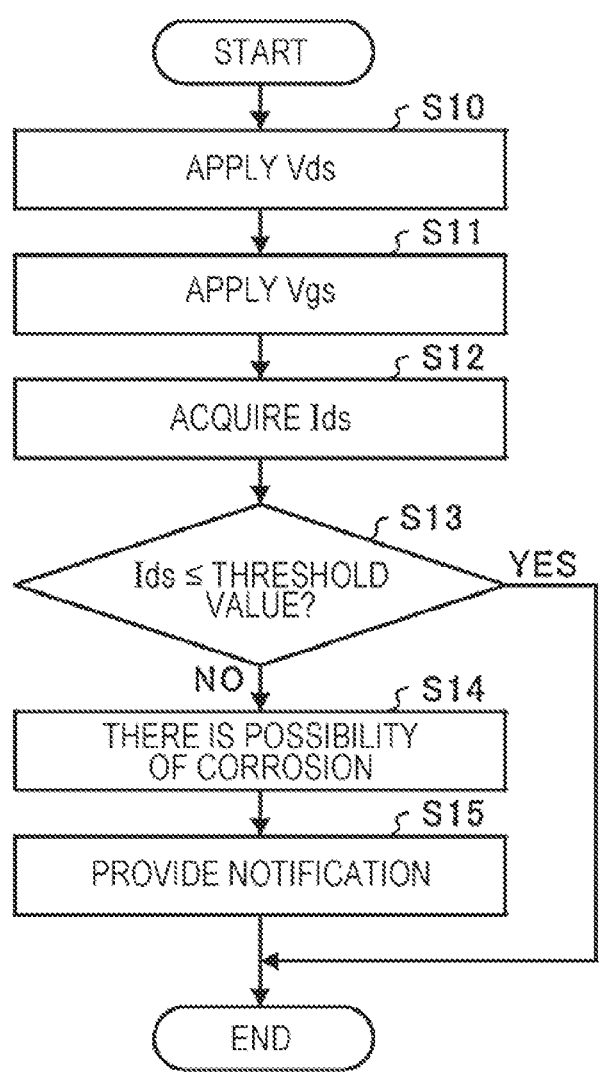
FIG. 7 is a flowchart illustrating the flow of operation of a first inspector in a vehicle.

FIG. 7 is a flowchart illustrating the flow of operation of the first inspector 44 in the vehicle 10. For example, the first inspector 44 commences the series of steps in FIG. 7 after a predetermined time period has elapsed from when the vehicle 10 is activated. For example, the predetermined time period is set to a time period in which the temperature of the batteries 20 becomes sufficiently high. Alternatively, the first inspector 44 may commence the series of steps in FIG. 7 when the temperature of the batteries 20 becomes higher than or equal to a predetermined temperature after the vehicle 10 is activated. Furthermore, the first inspector 44 may repeat the series of steps in FIG. 7 in predetermined cycles.

First, in step S10, the first inspector 44 applies a predetermined first bias voltage Vds to the first electrode 110. Then, in step S11, the first inspector 44 applies a predetermined second bias voltage Vgs to the reference electrode 116. The first bias voltage Vds and the second bias voltage Vgs may be identical values or may be different values.

In step S12, the first inspector 44 acquires the output current Ids from the current sensor 124 in the state where the first bias voltage Vds and the second bias voltage Vgs are applied. Then, in step S13, the first inspector 44 determines whether the acquired output current Ids is lower than or equal to the predetermined threshold value.

If the output current Ids is lower than or equal to the predetermined threshold value (YES in step S13), the first inspector 44 ends the series of steps. In this case, since there are not many chloride ions in the gap 118 of each chloride-ion detection sensor 30 disposed at a location where condensation tends to occur, it is assumed that not many chloride ions exist in the entire battery pack 22. In other words, in this case, it is assumed that the possibility of corrosion in the battery pack 22 is low.

If the output current Ids is higher than the predetermined threshold value (NO in step S13), the first inspector 44 determines in step S14 that the battery pack 22 is possibly corroded. Then, the first inspector 44 causes the notifier 34 to provide a notification indicating that the battery pack 22 is possibly corroded in step S15, and ends the series of steps. In this case, since there are many chloride ions in the gap 118 of each chloride-ion detection sensor 30 disposed at a location where condensation tends to occur, it is assumed that many chloride ions exist in the entire battery pack 22. If there are many chloride ions in the entire battery pack 22, it is assumed that the possibility of corrosion in the battery pack 22 is high, so that a notification about the high possibility of corrosion in the battery pack 22 is provided.

When the driver who drives the vehicle 10 recognizes the notification indicating that the battery pack 22 is possibly corroded, the driver takes the vehicle 10 to the inspection operator and requests the inspection operator to perform a detailed inspection.

Figure 8:
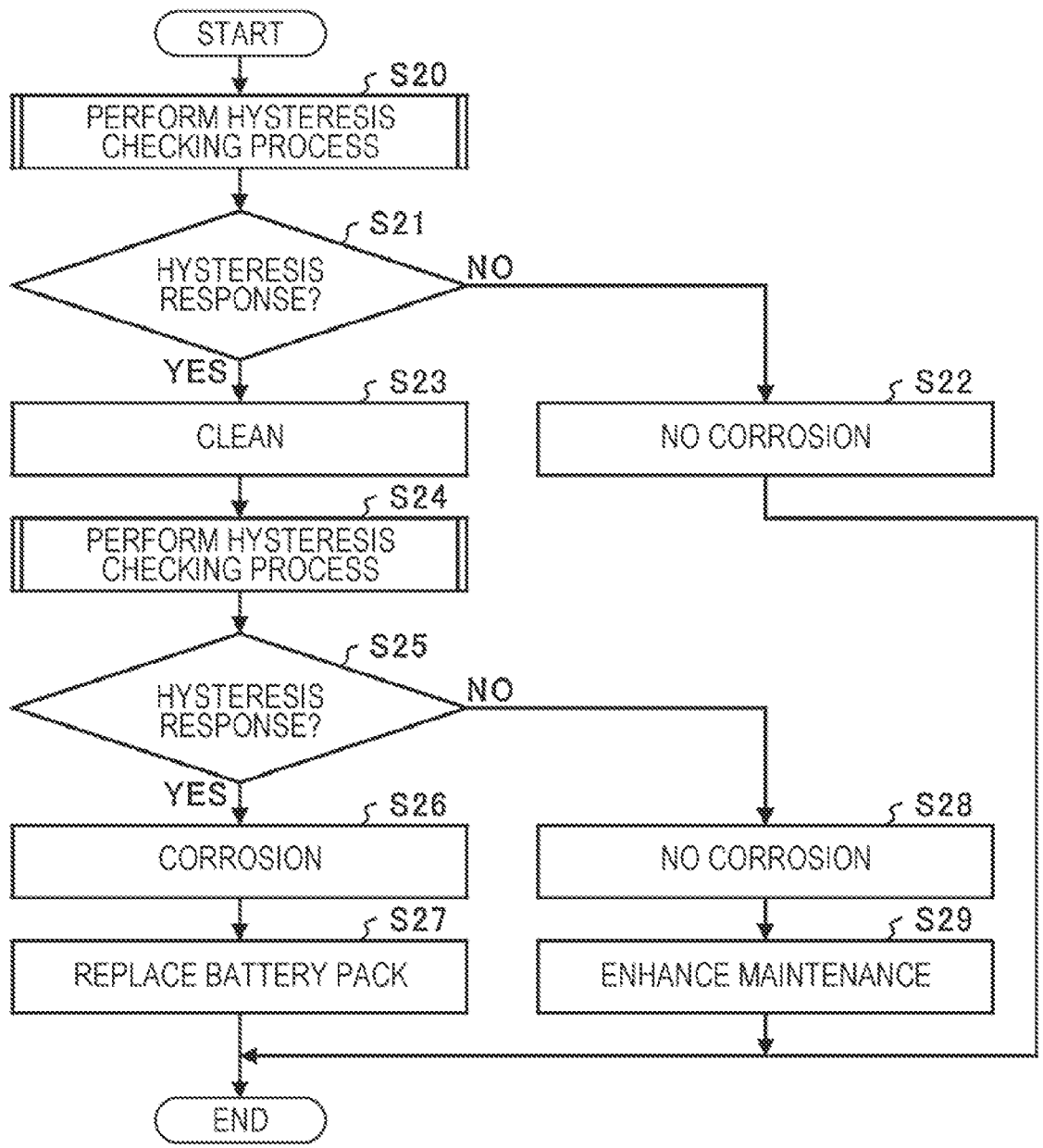
FIG. 8 is a flowchart illustrating the flow of an inspection by an inspection operator.

FIG. 8 is a flowchart illustrating the flow of the inspection by the inspection operator. The inspection operator couples the vehicle interface 36 of the vehicle 10 providing the notification about the possible corrosion of the battery pack 22 to the external-inspection-device interface 50 of the external inspection device 12 by using a cable. Accordingly, the external inspection device 12 can control the first controller 32 of the vehicle 10, so as to be capable of acquiring the detection result of each chloride-ion detection sensor 30 of the vehicle 10. Subsequently, a series of steps illustrated in FIG. 8 is performed.

First, in step S20, the inspection operator operates the external inspection device 12 to cause the second inspector 64 to perform a hysteresis checking process. The hysteresis checking process involves checking whether a change in the output current Ids relative to a change in the second bias voltage Vgs is a hysteresis response. The flow of the hysteresis checking process will be described in detail later. The hysteresis checking process performed in step S20 after the notification about the possible corrosion of the battery pack 22 is provided may sometimes be referred to as "first hysteresis checking process" hereinafter.

In step S21, the second inspector 64 determines whether it is determined in the first hysteresis checking process, that is, the hysteresis checking process in step S20, that the aforementioned change in the output current Ids is a hysteresis response.

If it is determined that the aforementioned change in the output current Ids is not a hysteresis response (NO in step S21), the second inspector 64 determines in step S22 that the battery pack 22 is not corroded, and ends the inspection by the external inspection device 12. In this case, although the notification is provided by the notifier 34 of the vehicle 10, it is regarded that the battery pack 22 is not corroded in reality. The second inspector 64 may clear the notification provided by the notifier 34 of the vehicle 10.

If it is determined that the aforementioned change in the output current Ids is a hysteresis response (YES in step S21), it is estimated that the battery pack 22 is possibly corroded. However, in this case, in order to enhance the measurement accuracy of each chloride-ion detection sensor 30, the second inspector 64 commands the inspection operator in step S23 to clean the chloride-ion detection sensor 30.

When the inspection operator recognizes the cleaning command, the inspection operator cleans each chloride-ion detection sensor 30. For example, the inspection operator prepares a cleaning device having a cleaning nozzle capable releasing a cleaning agent, such as water, a suction port capable of suctioning the cleaning agent, and a drying nozzle that releases drying air. The inspection operator inserts the cleaning nozzle of the cleaning device into the battery pack 22 from the inlet 86 of the intake duct 80 or the outlet 90 of the exhaust duct 82. Then, the inspection operator operates the cleaning device to cause the nozzle to release the cleaning agent, so as to clean each chloride-ion detection sensor 30 by using the cleaning agent. The inspection operator operates the cleaning device to cause the suction port to suction the cleaning agent released into the battery pack 22. The inspection operator operates the cleaning device to cause the drying nozzle to release drying air, so as to dry each chloride-ion detection sensor 30. A specific method used for cleaning each chloride-ion detection sensor 30 is not limited to the exemplified method, and may be any method. For example, each chloride-ion detection sensor 30 may be disposed in a detachable manner from the intake duct 80, the exhaust duct 82, or the battery pack 22. The inspection operator may clean each chloride-ion detection sensor 30 after removing the chloride-ion detection sensor 30 outward from the vehicle 10, and then attach the chloride-ion detection sensor 30 to its original position after the cleaning process.

If the battery pack 22 is corroded, it is assumed that there is a high possibility that the battery pack 22 is filled with chloride ions. Thus, in a situation where the battery pack 22 is corroded, even if each chloride-ion detection sensor 30 is cleaned, the chloride ions filling the inside of the battery pack 22 may adhere to the chloride-ion detection sensor 30 again.

After the cleaning process of each chloride-ion detection sensor 30 is completed by the inspection operator, the inspection operator operates the external inspection device 12 to cause the second inspector 64 to perform the hysteresis checking process again in step S24. The hysteresis checking process in step S24 is similar to the hysteresis checking process in step S20. The hysteresis checking process performed in step S24 after the cleaning process of each chloride-ion detection sensor 30 may sometimes be referred to as "second hysteresis checking process" hereinafter.

In step S25, the second inspector 64 determines whether it is determined in the second hysteresis checking process, that is, the hysteresis checking process in step S24, that the aforementioned change in the output current Ids is a hysteresis response.

If it is determined that the aforementioned change in the output current Ids is a hysteresis response (YES in step S25) even after each chloride-ion detection sensor 30 is cleaned, there is a high possibility that the battery pack 22 is filled with chloride ions. Therefore, the second inspector 64 determines in step S26 that the battery pack 22 is corroded. When the inspection operator recognizes the determination result indicating that the battery pack 22 is corroded, the inspection operator replaces the battery pack 22 in step S27 and ends the inspection.

If it is determined that the aforementioned change in the output current Ids is not a hysteresis response (NO in step S25) as a result of the hysteresis checking process after the cleaning process of each chloride-ion detection sensor 30, it is assumed that the number of chloride ions inside the battery pack 22 is not to an extent that they facilitate the corrosion of the battery pack 22. Therefore, the second inspector 64 determines in step S28 that the battery pack 22 is not corroded.

However, since it is once determined in the first hysteresis checking process before the cleaning process that the aforementioned change in the output current Ids is a hysteresis response, it is assumed that the battery pack 22 is in a situation where it tends to corrode easily. Thus, the second inspector 64 changes a maintenance setting in the first controller 32 to enhance corrosion-related maintenance for the battery pack 22 in step S29, and ends the inspection.

With the changed maintenance setting, the first inspector 44 of the vehicle 10 is configured to perform a process other than the inspection using each chloride-ion detection sensor 30, in addition to the inspection related to corrosion in the battery pack 22 using each chloride-ion detection sensor 30.

For example, the first inspector 44 additionally performs a process involving successively acquiring the outside air temperature and determining whether a state where the outside air temperature is lower than or equal to a predetermined temperature has continued for a predetermined time period or longer. If the first inspector 44 determines that the state where the outside air temperature is lower than or equal to the predetermined temperature has continued for the predetermined time period or longer, the first inspector 44 determines that the battery pack 22 is in a situation where it tends to corrode easily. When obtaining such a determination result, the first inspector 44 commences the series of steps illustrated in FIG. 7 even if the timing for executing the series of steps illustrated in FIG. 7 is not reached. Accordingly, the possibility of corrosion in the battery pack 22 can be detected at an early stage. The detailed content of the enhanced maintenance is not limited to that exemplified above, and may be any content.

Figure 9:
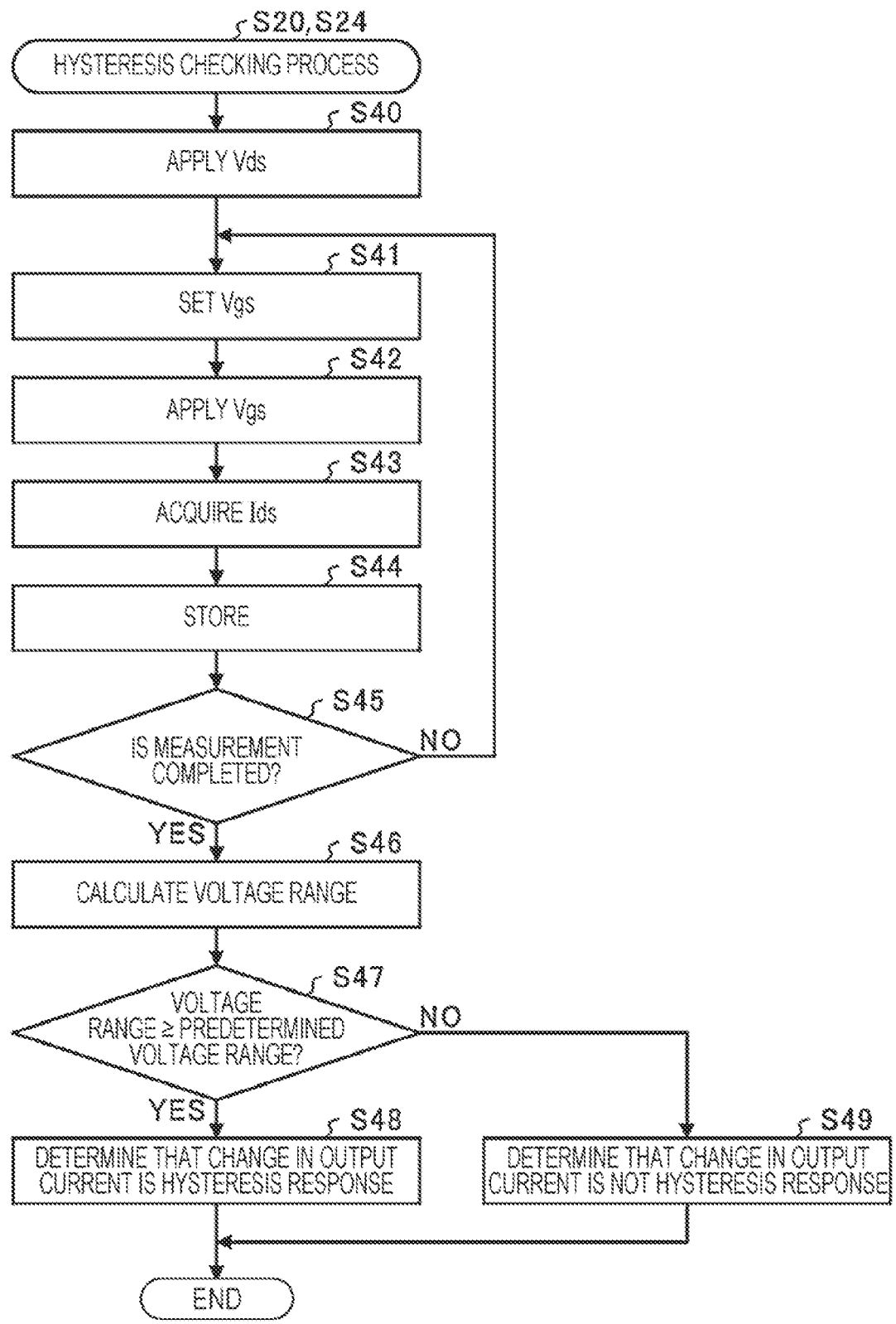
FIG. 9 illustrates the flow of a hysteresis checking process.

FIG. 9 illustrates the flow of the hysteresis checking process. A series of steps illustrated in FIG. 9 is performed in both the first hysteresis checking process in step S20 and the second hysteresis checking process in step S24.

When the hysteresis checking process commences, the second inspector 64 applies the first bias voltage Vds to the first electrode 110 in step S40.

Subsequently, in step S41, the second inspector 64 sets the second bias voltage Vgs. The setting order of the second bias voltage Vgs is set in advance such that the second bias voltage Vgs is incremented by a predetermined voltage from the minimum voltage Vgsmin to the maximum voltage Vgsmax and is subsequently decremented by the predetermined voltage from the maximum voltage Vgsmax to the minimum voltage Vgsmin. The second inspector 64 sets the current second bias voltage Vgs in accordance with this setting order.

In step S42, the second inspector 64 applies the set second bias voltage Vgs to the reference electrode 116. Then, in step S43, the second inspector 64 acquires the output current Ids at that time from the current sensor 124. In step S44, the second inspector 64 stores the applied second bias voltage Vgs and the acquired output current Ids in association with each other in the second memory 62.

Subsequently, in step S45, the second inspector 64 determines whether a measurement completion condition is satisfied. For example, if the second bias voltage Vgs is completely set in accordance with the predetermined setting order in step S41, the second inspector 64 determines that the measurement completion condition is satisfied.

If the second inspector 64 determines that the measurement completion condition is not satisfied (NO in step S45), the second inspector 64 returns to step S41 and sets a subsequent second bias voltage Vgs in the predetermined setting order in step S41.

In other words, the second inspector 64 repeatedly applies the second bias voltage Vgs while changing the second bias voltage Vgs, and acquires the output current Ids every time the second bias voltage Vgs is changed.

If the second inspector 64 determines in step S45 that the measurement completion condition is satisfied, the second inspector 64 calculates the voltage range based on the measurement result in step S46. For example, the second inspector 64 calculates a difference value by subtracting the output current Ids (i.e., the minimum current Idsmin) corresponding to the minimum voltage Vgsmin from the output current Ids (i.e., the maximum current Idsmax) corresponding to the maximum voltage Vgsmax. The second inspector 64 calculates the intermediate current Idsmid by dividing the difference value by 2. The second inspector 64 refers to the measurement result stored in the second memory 62 to acquire the increase voltage Vgsu and the decrease voltage Vgsd corresponding to the intermediate current Idsmid. The second inspector 64 calculates the voltage range by subtracting the decrease voltage Vgsd from the increase voltage Vgsu.

Subsequently, in step S47, the second inspector 64 determines whether the calculated voltage range is larger than or equal to the predetermined voltage range.

If the calculated voltage range is larger than or equal to the predetermined voltage range (YES in step S47), the second inspector 64 determines in step S48 that the change in the output current Ids relative to the change in the second bias voltage Vgs is a hysteresis response, and ends the hysteresis checking process.

If the calculated voltage range is smaller than the predetermined voltage range (NO in step S47), the second inspector 64 determines in step S49 that the change in the output current Ids relative to the change in the second bias voltage Vgs is not a hysteresis response, and ends the hysteresis checking process.

As described with reference to FIG. 8, the second inspector 64 determines whether the battery pack 22 is corroded based on the determination result of the hysteresis checking process.

Accordingly, in the inspection system 1 according to this embodiment, the configuration for air-cooling the batteries 20 in the vehicle 10 includes the chloride-ion detection sensors 30 disposed inside the battery pack 22. Consequently, in the inspection system 1 according to this embodiment, the chloride ions in the air introduced into the battery pack 22 for air-cooling the batteries 20 can be detected by the chloride-ion detection sensors 30. The inspection system 1 according to this embodiment performs an inspection related to corrosion of the battery pack 22 based on a detection value of each chloride-ion detection sensor 30. Accordingly, in the inspection system 1 according to this embodiment, corrosion in the battery pack 22 can be readily detected without replacing the battery pack 22.

As illustrated in FIG. 8, the inspection by the inspection operator involves performing the hysteresis checking process twice. By performing the hysteresis checking process twice, corrosion in the battery pack 22 can be detected with higher accuracy. Alternatively, instead of performing the hysteresis checking process twice, the hysteresis checking process may be performed once.

Figure 10:
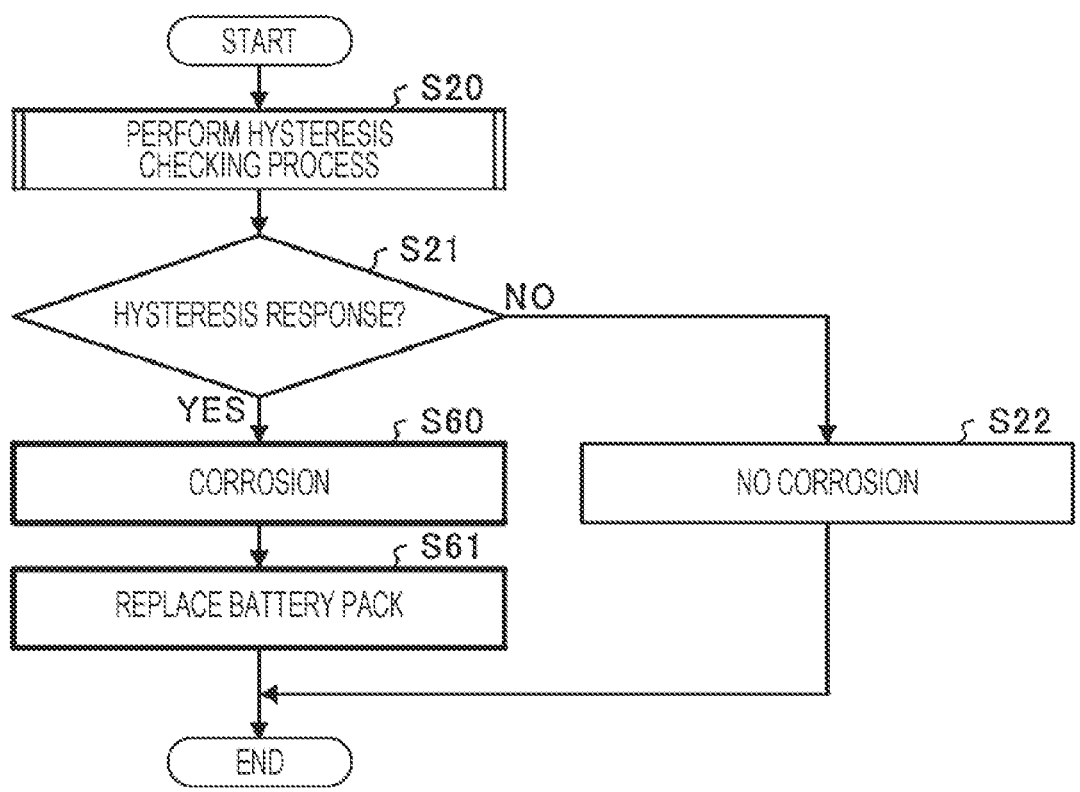
FIG. 10 is a flowchart illustrating an example where the hysteresis checking process is performed once.

FIG. 10 is a flowchart illustrating an example where the hysteresis checking process is performed once. FIG. 10 is equivalent to a case where the second hysteresis checking process is omitted from the flowchart in FIG. 8. As illustrated in FIG. 10, if it is determined that a change in the output current Ids relative to a change in the second bias voltage Vgs is a hysteresis response in the hysteresis checking process (YES in step S21), the second inspector 64 determines in step S60 that the battery pack 22 is corroded. When the inspection operator recognizes the determination result indicating that the battery pack 22 is corroded, the inspection operator replaces the battery pack 22 in step S61 and ends the inspection.

In the case where the hysteresis checking process is performed once, corrosion in the battery pack 22 can be detected with higher accuracy, as compared with a case where the inspection by the external inspection device 12 is not performed.

Furthermore, as mentioned above, if the output current Ids exceeds the predetermined threshold value, the first inspector 44 determines that the battery pack 22 is possibly corroded. Then, when the first inspector 44 determines that the battery pack 22 is possibly corroded, the second inspector 64 performs the hysteresis checking process and determines whether the battery pack 22 is corroded based on the determination result of the hysteresis checking process. Alternatively, the inspection by the second inspector 64 may be omitted, such that the inspection may at least be performed by the first inspector 44 alone. In this case, the first inspector 44 may clearly determine whether the battery pack 22 is corroded based on whether the output current Ids exceeds the threshold value.

Figure 11:
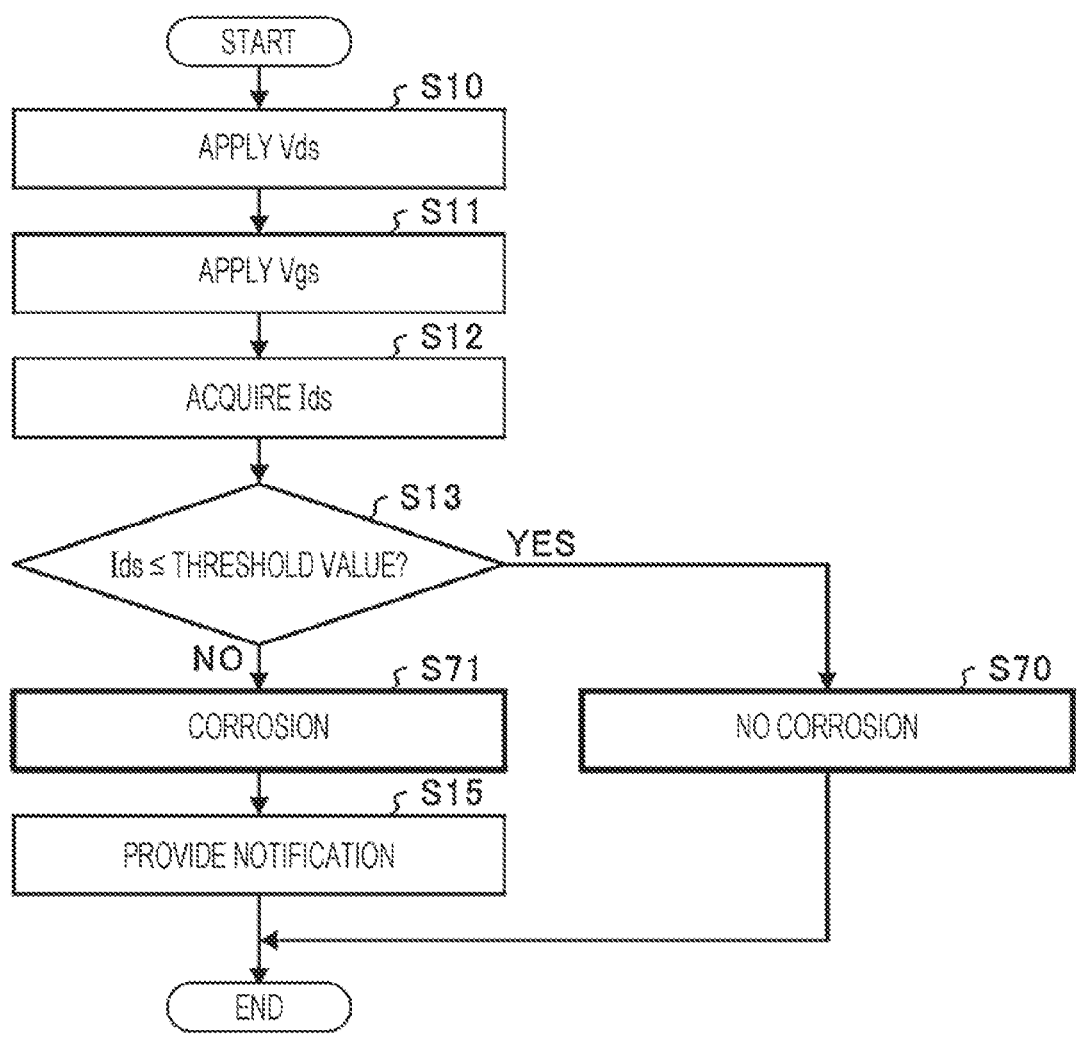
FIG. 11 is a flowchart illustrating an example where an inspection is performed using the first inspector alone.

FIG. 11 is a flowchart illustrating an example where the inspection is performed by the first inspector 44 alone. As illustrated in FIG. 11, if the output current Ids is lower than or equal to the predetermined threshold value (YES in step S13), the first inspector 44 determines in step S70 that the battery pack 22 is not corroded.

If the output current Ids exceeds the predetermined threshold value (NO in step S13), the first inspector 44 determines in step S71 that the battery pack 22 is corroded. Then, the first inspector 44 causes the notifier 34 to provide a notification indicating that the battery pack 22 is corroded in step S15.

In this example, corrosion in the battery pack 22 can be detected without the external inspection device 12 performing an inspection, thereby reducing the load of inspection by the inspection operator.

Although the embodiment of the disclosure has been described above with reference to the appended drawings, the disclosure is not limited to the above embodiment. It is apparent to a person skilled in the art that various modifications and alterations are conceivable within the scope defined in the claims, and it is to be understood that such modifications and alterations naturally belong to the technical scope of the disclosure.

For example, in the above embodiment, the second controller 54 is provided in the external inspection device 12. Alternatively, the second controller 54 may be provided in the vehicle 10. In other words, in the vehicle 10, the second inspector 64 may perform an inspection including the hysteresis checking process.

The first controller 32 illustrated in FIG. 1 can be implemented by circuitry including at least one semiconductor integrated circuit such as at least one processor (e.g., a central processing unit (CPU)), at least one application specific integrated circuit (ASIC), and/or at least one field programmable gate array (FPGA). At least one processor can be configured, by reading instructions from at least one machine readable tangible medium, to perform all or a part of functions of the first controller 32 including at least one first processor 40 and at least one first memory 42. Such a medium may take many forms, including, but not limited to, any type of magnetic medium such as a hard disk, any type of optical medium such as a CD and a DVD, any type of semiconductor memory (i.e., semiconductor circuit) such as a volatile memory and a non-volatile memory. The volatile memory may include a DRAM and a SRAM, and the non-volatile memory may include a ROM and a NVRAM. The ASIC is an integrated circuit (IC) customized to perform, and the FPGA is an integrated circuit designed to be configured after manufacturing in order to perform, all or a part of the functions of the modules illustrated in FIG. 1.

The invention claimed is:

1. An inspection system comprising:
   a battery pack configured to accommodate a battery equipped in a vehicle;
   an intake duct configured to guide air outside the vehicle into the battery pack to air-cool the battery;
   an exhaust duct configured to guide air inside the battery pack outward from the vehicle;
   at least one chloride-ion detection sensor disposed inside the battery pack and configured to detect a chloride ion inside the battery pack; and
   a first controller,
   wherein the first controller comprises
      at least one first processor, and
      at least one first memory coupled to the at least one first processor,
      wherein the at least one first processor is configured to execute a process comprising performing an inspection of corrosion of the battery pack based on a detection value detected by the chloride-ion detection sensor.

2. The inspection system according to claim 1,
   wherein the at least one chloride-ion detection sensor is disposed at a position located near one or both of an end of the intake duct and an end of the exhaust duct, the end of the intake duct having an opening exposed to inside of the battery pack, the end of the exhaust duct having an opening exposed to inside of the battery pack.

3. An inspection system comprising:
   a battery pack configured to accommodate a battery equipped in a vehicle;
   an intake duct configured to guide air outside the vehicle into the battery pack to air-cool the battery;
   an exhaust duct configured to guide air inside the battery pack outward from the vehicle;
   at least one chloride-ion detection sensor disposed inside the battery pack and configured to detect a chloride ion; and
   a first controller,
   wherein the first controller comprises
      at least one first processor, and
      at least one first memory coupled to the at least one first processor,
      wherein the at least one first processor is configured to execute a process comprising performing an inspection of corrosion of the battery pack based on a detection value detected by the chloride-ion detection sensor,
   wherein the battery pack comprises
      a water container configured such that at least an area on an inner surface of a bottom of the battery pack is recessed toward outside of the battery pack, and
      wherein the at least one chloride-ion detection sensor is disposed at a position of the water container.

4. An inspection system comprising:
   a battery pack configured to accommodate a battery equipped in a vehicle;
   an intake duct configured to guide air outside the vehicle into the battery pack to air-cool the battery;
   an exhaust duct configured to guide air inside the battery pack outward from the vehicle;
   at least one chloride-ion detection sensor disposed inside the battery pack and configured to detect a chloride ion; and
   a first controller,
   wherein the first controller comprises
      at least one first processor, and
      at least one first memory coupled to the at least one first processor,
      wherein the at least one first processor is configured to execute a process comprising performing an inspection of corrosion of the battery pack based on a detection value detected by the chloride-ion detection sensor,
   wherein the chloride-ion detection sensor is a semiconductor sensor comprising a first electrode, a second electrode, a control electrode, and a reference electrode disposed with a predetermined gap from the control electrode, the semiconductor sensor being configured such that an electric potential of the control electrode changes in accordance with a voltage to be applied to the reference electrode and a concentration of chloride ions in the predetermined gap and that an electric current between the first electrode and the second electrode changes in accordance with the electric potential of the control electrode,
   wherein the chloride-ion detection sensor is configured to detect the electric current between the first electrode and the second electrode as the detection value when the voltage is applied to the reference electrode, and
   wherein the first processor is configured to determine that the battery pack is possibly corroded in a case where the detection value of the chloride-ion detection sensor exceeds a predetermined threshold value.

5. The inspection system according to claim 4, further comprising:
   a second controller,
   wherein the second controller comprises
      at least one second processor, and
      at least one second memory coupled to the second processor,
      wherein the at least one second processor is configured to perform a process comprising
         performing a hysteresis checking process in a case where the first processor determines that the battery pack is possibly corroded, the hysteresis checking process comprising changing the voltage to be applied to the reference electrode and determining whether a change in the electric current between the first electrode and the second electrode relative to a change in the voltage to be applied to the reference electrode is a hysteresis response, and determining whether the battery pack is corroded based on a determination result of the hysteresis checking process.

\* \* \* \* \*